(12) United States Patent
Fukada et al.

(10) Patent No.: US 6,304,448 B1
(45) Date of Patent: Oct. 16, 2001

(54) POWER MODULE

(75) Inventors: Masakazu Fukada; Dai Nakajima; Ken Takanashi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/657,236

(22) Filed: Sep. 7, 2000

(30) Foreign Application Priority Data

Mar. 3, 2000 (JP) .................................................. 12-058676

(51) Int. Cl.⁷ ....................................................... H01K 7/20
(52) U.S. Cl. .......................... 361/700; 361/702; 361/705; 361/719; 361/806; 257/723; 257/718; 257/692; 174/16.3; 307/10.1
(58) Field of Search ..................... 361/600, 679, 361/686, 687, 689, 701–712, 714–723, 816, 735–738, 750–752, 683, 753; 257/696, 706, 713, 723, 724, 796, 728, 762, 764, 770; 174/16.3, 52.1, 52.2, 50.51, 50.52, 35 MS, 50.54, 58, 35 R; 165/80.3, 80.6, 185, 104.21, 104.33, 104.34; 251/712–718, 706–708, 746, 747, 668, 684, 796; 428/64, 65, 195, 522; 29/390.03, 521, 505, 557; 318/139, 494, 504, 432–434; 364/424.01; 307/9.1, 101, 147, 58, 45, 82

(56) References Cited

U.S. PATENT DOCUMENTS 5,291,065 * 3/1994 Arai et al. ............................. 257/723
5,504,378 * 4/1996 Lindberg et al. ..................... 307/10.1
5,751,058 * 5/1998 Matsuki ................................. 257/692
5,920,119 * 7/1999 Tamba et al. ......................... 257/718
5,966,291 * 10/1999 Baumel et al. ....................... 361/707
5,968,386 * 10/1999 Goenka et al. ....................... 174/52.2
6,166,937 * 12/2000 Yamamura et al. .................. 363/141
6,219,245 * 4/2001 Nagashima et al. ................. 361/705

* cited by examiner

*Primary Examiner*—Gerald Tolin
*Assistant Examiner*—Michael Datskovsky
(74) *Attorney, Agent, or Firm*—Oblon, Spivak, McClelland, Maier & Neustadt, P.C.

(57) ABSTRACT

Obtained is a power module which is excellent in electromagnetic shielding effects, is rarely influenced by external noises and acts as an external noise source with difficulty. An insulating substrate (5) is bonded through a solder (4) to a top surface of a heat sink (3) fixed to a support plate (2). A DC capacitor (16) is fixed to a bottom face of the heat sink (3) by adhesion. A control substrate (11) having a control IC (13) mounted thereon is fixed to the support plate (2). Moreover, a plurality of electrodes (10), a DC side electrode and refrigerant inlet-outlet (9) and a control connector (15) are provided on the support plate (2). A case (1) is fixed to a peripheral portion of the support plate (2), and surrounds the insulating substrate (5), the control substrate (11), the heat sink (3) and the DC capacitor 16 together with the support plate (2). Both the case (1) and the support plate (2) have conducting property.

13 Claims, 3 Drawing Sheets

POWER MODULE

BACKGROUND OF THE INVENTION

1. Field of the Invention

The present invention relates to a structure of a power module, and more particularly to a structure of a power module comprising an insulating substrate having a power semiconductor device mounted thereon and a control substrate on which a control IC for controlling the power semiconductor device is mounted.

2. Description of the Background Art

FIGS. 5 and 6 are perspective and sectional views showing a structure of a conventional power module. As shown in FIG. 6, the conventional power module comprises an insulating substrate 105 and a control substrate 113 on which circuit patterns (not shown) are formed respectively, interconnection leads 110 and 120, and an insulating case 107. A power semiconductor device 109 is mounted on the insulating substrate 105 through a solder 108. The insulating substrate 105 is provided in contact with a metallic base plate 102 through a solder 104.

A control IC 115 for controlling the power semiconductor device 109 is mounted on the control substrate 113 through a solder 114. One of ends of the interconnection lead 110 is electrically connected to the insulating substrate 105 or the power semiconductor device 109 through a metal wire 111. The other end of the interconnection lead 110 is electrically connected to an electrode 122 provided on the control substrate 113. The electrode 122 is electrically connected to the control IC 115. One of ends of the interconnection lead 120 is electrically connected to the power semiconductor device 109 through a metal wire 121. The other end of the interconnection lead 120 is electrically connected to an electrode 123 provided on the insulating case 107.

The insulating substrate 105, the control substrate 113 and the interconnection leads 110 and 120 are provided in the insulating case 107. An internal space of the insulating case 107 provided below the control substrate 113 is filled with a silicone gel 112. Moreover, a cover 117 is fixed to a top of the insulating case 107. The control IC 115 is electrically connected to a control connector 119 provided on the cover 117 through an external connecting terminal 118 soldered onto the control substrate 113.

The base plate 102 is fixed to a heat sink 101 with a bolt 103. A thermal conduction grease 116 is coated comparatively thickly (approximately several hundreds $\mu$ms) between the base plate 102 and the heat sink 101.

According to such a conventional power module, however, an electromagnetic shield is not fully formed for the insulating substrate 105 and the control substrate 113. Therefore, there has been a problem in that the power module is easily influenced by external noises made by a driving motor or the like and reliability is deteriorated.

Moreover, the base plate 102 and the heat sink 101 are fixed to each other with the bolt 103. For this reason, it is necessary to provide a space for forming a bolt hole for the bolt 103 in an upper surface of the heat sink 101. Consequently, there has been a problem in that the size of the heat sink 101 is increased.

Furthermore, a warp is easily generated on the insulating case 107 and the base plate 102 by heating for thermosetting the silicone gel 112 and heating for bonding the insulating substrate 105 to the base plate 102. Consequently, the thickness of the thermal conduction grease 116 cannot be reduced so that a thermal resistance is increased and heat-radiation effects produced by the heat sink 101 are reduced.

SUMMARY OF THE INVENTION

In order to solve the problems, it is an object of the present invention to obtain a power module which is mainly excellent in electromagnetic shielding effects, is rarely influenced by external noises and acts as an external noise source with difficulty.

A first aspect of the present invention is directed to a power module comprising an insulating substrate having a main surface on which a power semiconductor device is mounted, a control substrate on which a control IC for controlling the power semiconductor device is mounted, a conductive support plate to which the insulating substrate and the control substrate are fixed, and a conductive case fixed to a peripheral portion of the support plate for surrounding the insulating substrate and the control substrate together with the support plate.

A second aspect of the present invention is directed to the power module according to the first aspect of the present invention, further comprising a heat sink provided in the case and kept in contact with a back face of the insulating substrate which is opposite to the main surface, the support plate including a refrigerant inlet-outlet coupled to the heat sink, an electrode electrically connected to the power semiconductor device, and a control connector electrically connected to the control IC, all of them being provided through the support plate.

A third aspect of the present invention is directed to the power module according to the second aspect of the present invention, wherein the power semiconductor device is a voltage-source inverter, the power module further comprising a DC capacitor provided in contact with the heat sink opposite to the insulating substrate in the case.

A fourth aspect of the present invention is directed to the power module according to any of the first to third aspects of the present invention, further comprising a shield plate provided between the insulating substrate and the control substrate in the case.

A fifth aspect of the present invention is directed to the power module according to any of the first to fourth aspects of the present invention, wherein the case and the support plate are bonded to each other with sealing property kept therein.

A sixth aspect of the present invention is directed to the power module according to the fifth aspect of the present invention, wherein an internal space constituted by the case and the support plate is filled with an inactive material having insulating property.

A seventh aspect of the present invention is directed to the power module according to the sixth aspect of the present invention, wherein the material functions as a refrigerant, the power module further comprising a fan provided in the case for circulating the material in the case.

According to the first aspect of the present invention, both the insulating substrate and the control substrate are surrounded by the conductive case and the support plate. Therefore, it is possible to obtain a power module which is excellent in electromagnetic shielding effects, is rarely influenced by external noises and acts as an external noise source with difficulty.

According to the second aspect of the present invention, the refrigerant inlet outlet, the electrode and the control connector are collectively formed on the support plate. Consequently, the structure of the case can be simplified.

According to the third aspect of the present invention, it is possible to relieve the influence of external noises on the DC capacitor. In addition, the DC capacitor is provided in contact with the heat sink. Therefore, heat generated from the DC capacitor can be absorbed properly through the heat sink.

According to the fourth aspect of the present invention, it is possible to obtain electromagnetic shielding effects between the power semiconductor device and the control substrate.

According to the fifth aspect of the present invention, it is possible to obtain a power module which is excellent in dustproof property and waterproof property.

According to the sixth aspect of the present invention, the reliability of the power module can be enhanced.

According to the seventh aspect of the present invention, it is possible to wholly cool the inside of the case with the circulated refrigerant, resulting in an enhancement in heat-radiation effects.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
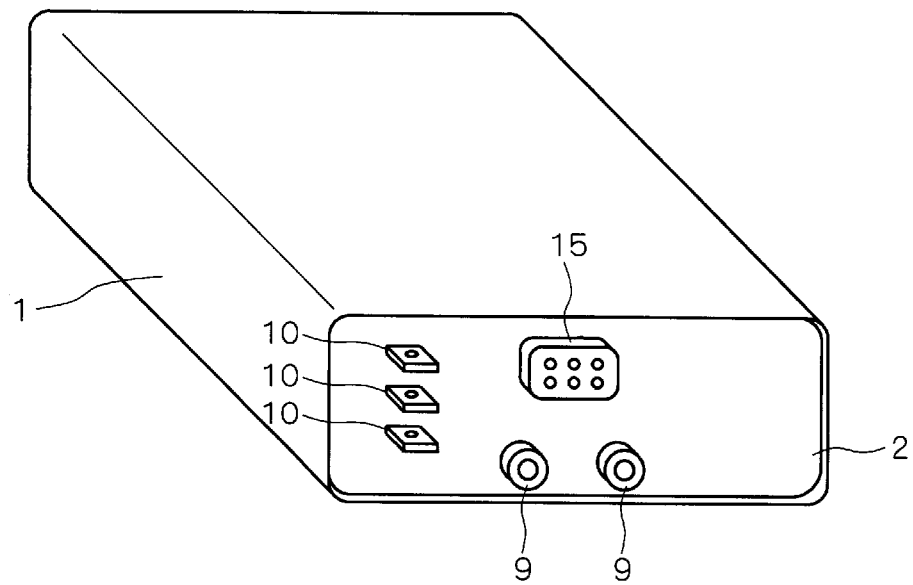
FIG. 1 is a perspective view showing a structure of a power module according to an embodiment of the present invention.
Figure 2:
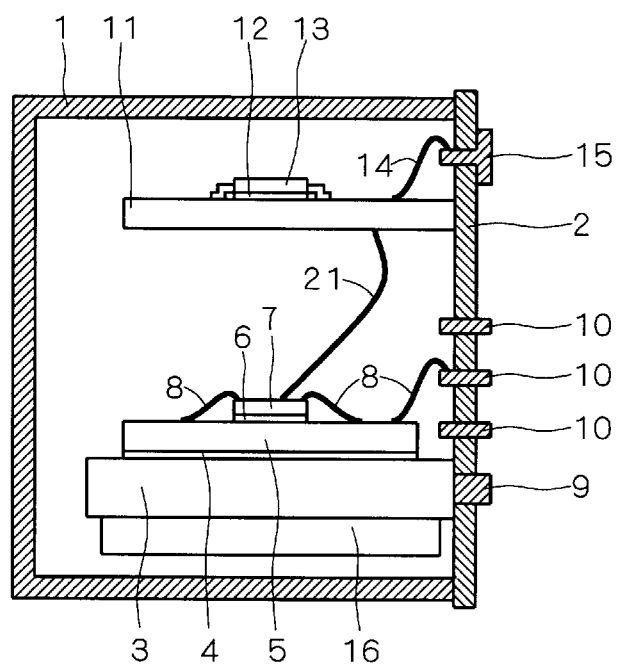
FIG. 2 is a sectional view showing the structure of the power module according to the embodiment of the present invention.

FIGS. 1 and 2 are perspective and sectional views showing a structure of a power module according to an embodiment of the present invention. For convenience of description and simplicity of the drawings, the sectional view of FIG. 2 does not always correspond to a section of the structure shown in the perspective view of FIG. 1. Referring to FIG. 1, the power module according to the present embodiment comprises two members, that is, a case 1 and a support plate 2 in appearance. Referring to FIG. 2, a power semiconductor device 7 such as a voltage-source inverter is mounted on a top surface of an insulating substrate 5 through a solder 6. A main circuit which is not shown is formed on the top surface of the insulating substrate 5. The main circuit is electrically connected to the power semiconductor device 7 through a metal wire 8 and includes a switching circuit and the like. The insulating substrate 5 is bonded through a solder 4 to a top surface of a heat sink 3 fixed to the support plate 2. A DC capacitor 16 having a pair of P and N electrodes (not shown) is fixed to a bottom face of the heat sink 3 by adhesion. The DC capacitor 16 serves to prevent a voltage fluctuation in a power module for large power. The P and N electrodes of the DC capacitor 16 are connected to an external power source, a battery or the like through a DC side electrode and refrigerant inlet-outlet 9.

A control substrate 11 is fixed to the support plate 2. A control IC 13 for controlling the power semiconductor device 7 is mounted on a top surface of the control substrate 11 through a solder 12. Moreover, a circuit pattern which is not shown is formed on the top surface of the control substrate 11. The circuit pattern is electrically connected to the control IC 13. The control substrate 11 is electrically connected to the power semiconductor device 7 through a metal wire 21.

The support plate 2 is provided with a plurality of (three in FIGS. 1 and 2) electrodes 10, the DC side electrode and refrigerant inlet-outlet 9, and a control connector 15. The electrode 10 is electrically connected through the metal wire 8 to the main circuit formed on the top surface of the insulating substrate 5. The DC side electrode and refrigerant inlet-outlet 9 is coupled to the heat sink 3. The control connector 15 is electrically connected through a metal wire 14 to the circuit pattern formed on the top surface of the control substrate 11. More specifically, the control connector 15 is electrically connected indirectly to the control IC 13. The control connector 15 serves to transmit and receive a control signal between an internal circuit and an external circuit. All of the electrode 10, the DC side electrode and refrigerant inlet-outlet 9 and the control connector 15 are formed through the support plate 2, and are fixed to the support plate 2 by adhesion, for example. In this case, the use of a room temperature setting adhesive can prevent a warp from being generated on the support plate 2.

The case 1 is fixed to a peripheral portion of the support plate 2, and surrounds the insulating substrate 5, the control substrate 11, the heat sink 3 and the DC capacitor 16 together with the support plate 2. More specifically, the insulating substrate 5, the control substrate 11, the heat sink 3 and the DC capacitor 16 are provided in an internal space constituted by the case 1 and the support plate 2. The case 1 and the support plate 2 are bonded to each other through seam welding, adhesion or the like, for example. Consequently, it is possible to maintain sealing property of the internal space constituted by the case 1 and the support plate 2 and to obtain a power module which is excellent in environment-proof property such as dustproof property, waterproof property or the like. In the case in which the bonding is to be carried out by adhesion, it is desirable that a conductive adhesive should be used. Thus, electromagnetic shielding effects can be enhanced.

In order to have conducting property, the case 1 is formed of a metal having corrosion resistance property, stainless, a metal having a surface coated with a metallic thin film having corrosion resistance property by plating or the like, a resin, ceramic or plastic. For example, the case 1 is formed by the deep drawing of aluminum. The case 1 is not always constituted as a housing but may be constituted as a laminated film in which a plastic thin film is formed on a metal foil. With such a structure, it is possible to easily perform a manufacturing process and to reduce a manufacturing cost.

The support plate 2 causes the peripheries of the electrode 10 and the DC side electrode and refrigerant inlet-outlet 9 to have insulating property and is formed of a metal. Alternatively, a conductive layer such as a metal foil may be stuck to a surface of an insulating substrate except the peripheries of the electrode 10 and the DC side electrode and refrigerant inlet-outlet 9. Consequently, it is possible to prevent each electrode from being short-circuited and to make the support plate 2 have conducting property.

Moreover, the internal space constituted by the case 1 and the support plate 2 may be filled with an inactive material having insulating property, for example, pure water, oil, a silicone gel, $SF_6$, a flon gas, carbon dioxide, an ammonia gas or the like. If the internal space is sealed with an epoxy resin, for example, a warp is generated on the case 1 in a thermosetting process. However, in the case in which the internal space is filled with oil or a gel, such a problem does not arise.

According to the power module of the present embodiment, thus, both the insulating substrate 5 and the control substrate 11 are surrounded by the conductive case 1 and the support plate 2. Accordingly, it is possible to obtain a power module which is excellent in electromagnetic shielding effects, is rarely influenced by external noises and acts as an external noise source with difficulty.

The insulating substrate 5 is bonded to the top surface of the heat sink 3 through the solder 4 or the like, and a bolt is not used differently from a conventional example. Therefore, it is not necessary to form a bolt hole on the heat sink 3. Consequently, the size of the heat sink 3 can also be reduced. In addition, the conventional base plate can be omitted and the thermal conduction grease is not required. Thus, a thermal resistance can be reduced, resulting in an enhancement in heat-radiation effects of the heat sink 3.

Moreover, the DC capacitor 16 is also provided in the case 1. Therefore, it is possible to relieve the influence of the external noises. In the case in which the DC capacitor 16 is provided on the outside of the case 1, an inductance component of the main circuit is increased but the above-mentioned problem does not arise. In addition, the DC capacitor 16 is provided in contact with the heat sink 3. Therefore, heat generated from the DC capacitor 16 can be absorbed properly by the heat sink 3.

Figure 3:
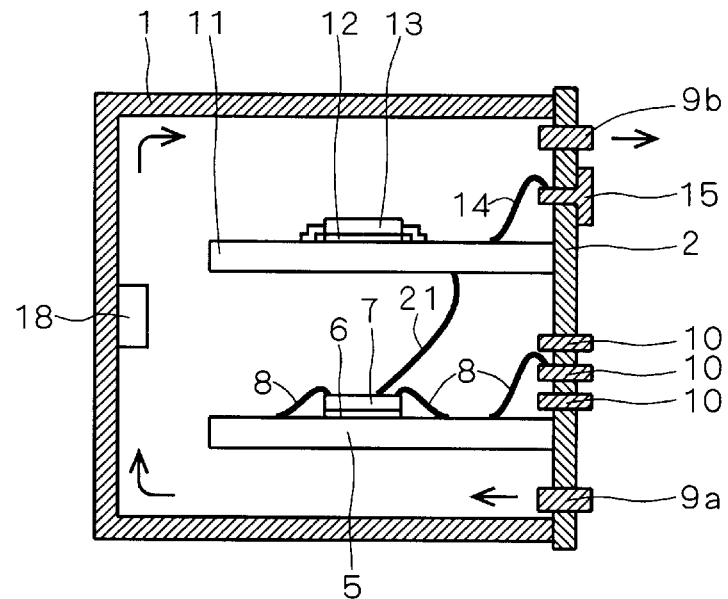
FIG. 3 is a sectional view showing a structure of a power module according to a first variant of the embodiment of the present invention.

FIG. 3 is a sectional view showing a structure of a power module according to a first variant of the embodiment of the present invention. The heat sink 3 is omitted from the power module shown in FIG. 2 and a fan 18 is provided in a case 1. A DC capacitor 16 is not shown but is fixed to a support plate 2 in the case 1. A refrigerant supplied from a DC side electrode and refrigerant inlet 9a into the case 1 is circulated in the case 1 by means of the fan 18, and is then discharged to the outside through a DC side electrode and refrigerant outlet 9b. In the same manner as described above, for example, pure water, oil, $SF_6$, a flon gas, carbon dioxide, an ammonia gas or the like can be used for the refrigerant. Consequently, the inside of the case 1 can be wholly cooled with the circulated refrigerant so that cooling effects can be enhanced.

Figure 4:
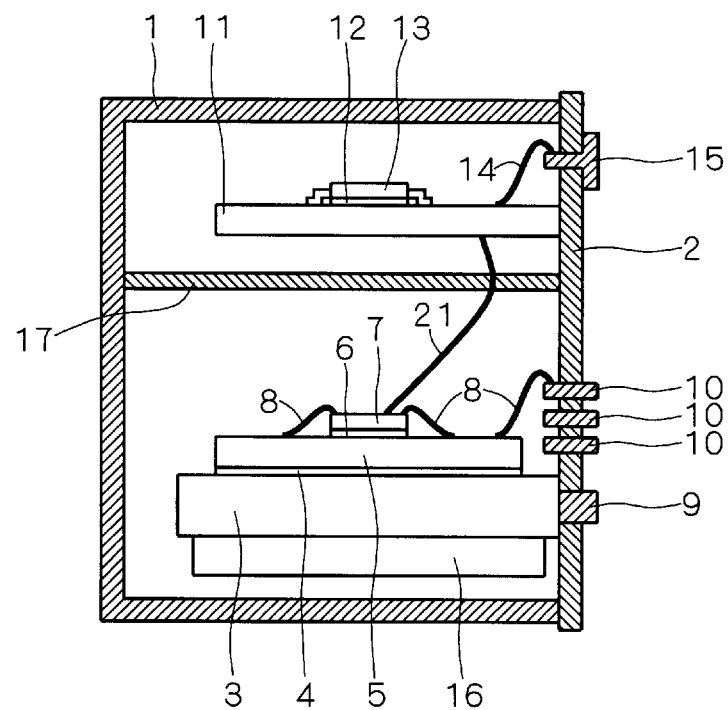
FIG. 4 is a sectional view showing a structure of a power module according to a second variant of the embodiment of the present invention.
Figure 5:
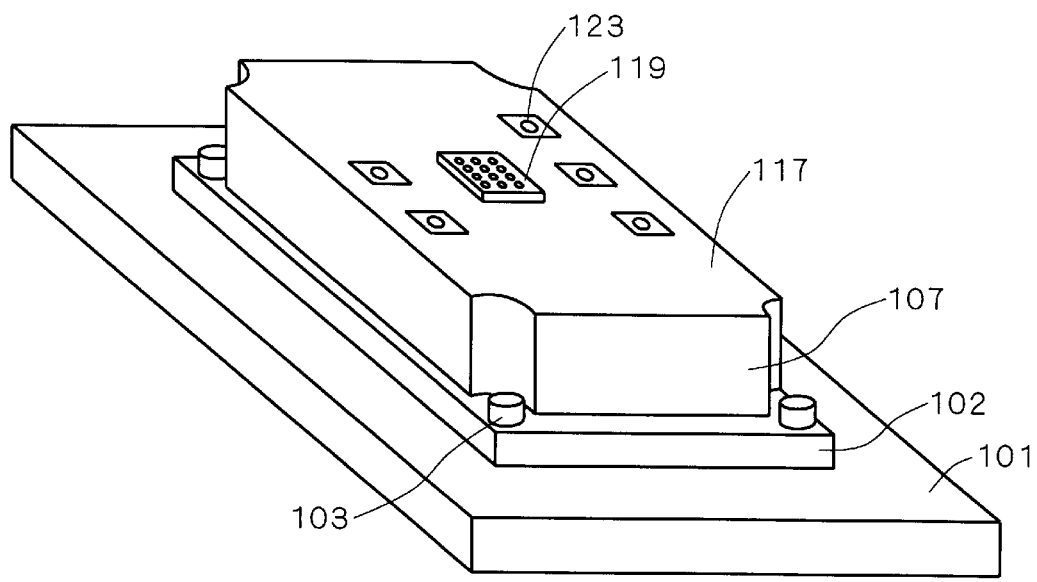
FIG. 5 is a perspective view showing a structure of a conventional power module.
Figure 6:
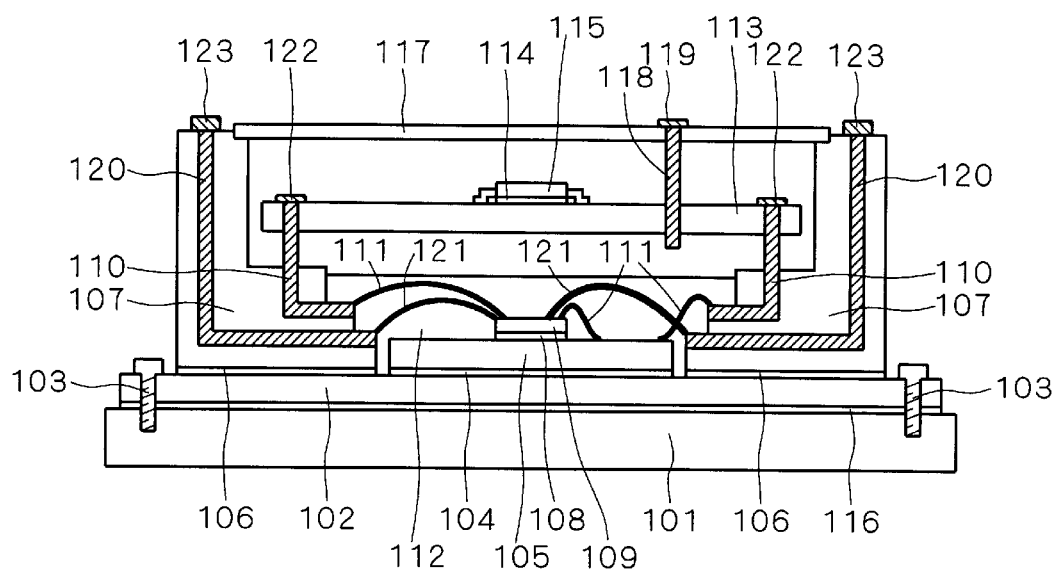
FIG. 6 is a sectional view showing the structure of the conventional power module.

FIG. 4 is a sectional view showing a structure of a power module according to a second variant of the embodiment of the present invention. A conducive shield plate 17 is further provided in the power module shown in FIG. 2. The shield plate 17 is provided between an insulating substrate 5 and a control substrate 11 in a case 1. Consequently, it is possible to obtain electromagnetic shielding effects between a power semiconductor device 7 and the control substrate 11.

While the invention has been described in detail, the foregoing description is in all aspects illustrative and not restrictive. It is understood that numerous other modifications and variations can be devised without departing from the scope of the invention.

What is claimed is:

1. A power module comprising:
    an insulating substrate having a main surface on which a power semiconductor device is mounted;
    a control substrate on which a control IC for controlling said power semiconductor device is mounted;
    a conductive support plate to which said insulating substrate and said control substrate are directly fixed; and
    a conductive case fixed to a peripheral portion of said support plate for surrounding said insulating substrate and said control substrate together with said support plate.

2. The power module according to claim 1, further comprising a heat sink provided in said case and kept in contact with a back face of said insulating substrate which is opposite to said main surface,
    said support plate including:
        a refrigerant inlet-outlet coupled to said heat sink;
        an electrode electrically connected to said power semiconductor device; and
        a control connector electrically connected to said control IC,
    all of them being provided through said support plate.

3. The power module according to claim 2, wherein said power semiconductor device is a voltage-source inverter,
    said power module further comprising a DC capacitor provided in contact with said heat sink opposite to said insulating substrate in said case.

4. The power module according to claim 3, wherein said DC capacitor has P and N electrodes making a pair, and
    said refrigerant inlet-outlet is connected as a DC side electrode and refrigerant inlet-outlet to said P and N electrodes.

5. The power module according to claim 2, wherein said refrigerant inlet-outlet, said electrode and said control connector are bonded to said support plate with a room temperature setting adhesive.

6. The power module according to claim 1, further comprising a shield plate provided between said insulating substrate and said control substrate in said case.

7. The power module according to claim 1, wherein said case and said support plate are bonded to each other with sealing property kept therein.

8. The power module according to claim 7, wherein said case and said support plate are bonded to each other by seam welding.

9. The power module according to claim 7, wherein said case and said support plate are bonded to each other by adhesion.

10. The power module according to claim 9, wherein said case and said support plate are bonded with a conductive adhesive.

11. The power module according to claim 7, wherein an internal space constituted by said case and said support plate is filled with an inactive material having insulating property.

12. The power module according to claim 11, wherein said material functions as a refrigerant,
    said power module further comprising a fan provided in said case for circulating said material in said case.

13. The power module according to claim 1, wherein said case is constituted by a laminated film in which a plastic thin film is formed on a metal foil.

* * * * *